United States Patent
Wang et al.

(10) Patent No.: US 7,320,921 B2
(45) Date of Patent: Jan. 22, 2008

(54) SMART GRADING IMPLANT WITH DIFFUSION RETARDING IMPLANT FOR MAKING INTEGRATED CIRCUIT CHIPS

(75) Inventors: Chih-Hao Wang, Hsin-Chu (TW); Ta-Wei Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 320 days.

(21) Appl. No.: 11/086,498

(22) Filed: Mar. 22, 2005

(65) Prior Publication Data

US 2006/0216900 A1  Sep. 28, 2006

(51) Int. Cl.
*H01L 21/336* (2006.01)
(52) U.S. Cl. ................ 438/306; 438/162; 257/E21.343
(58) Field of Classification Search ........ 257/E21.343; 438/162, 306
See application file for complete search history.

(56) References Cited

U.S. PATENT DOCUMENTS

| | | | |
|---|---|---|---|
| 4,755,865 A | 7/1988 | Wilson et al. | |
| 5,108,935 A | 4/1992 | Rodder | |
| 5,576,226 A | 11/1996 | Hwang | |
| 5,585,286 A | 12/1996 | Aronowitz et al. | |
| 5,885,861 A | 3/1999 | Gardner et al. | |
| 5,933,721 A | 8/1999 | Hause et al. | |
| 5,959,333 A | 9/1999 | Gardner et al. | |
| 6,225,151 B1 * | 5/2001 | Gardner et al. | 438/162 |
| 6,268,640 B1 | 7/2001 | Park et al. | |
| 6,271,095 B1 | 8/2001 | Yu | |
| 6,458,641 B2 | 10/2002 | Tsukamoto | |
| 6,475,885 B1 | 11/2002 | Sultan | |
| 6,680,250 B1 | 1/2004 | Paton et al. | |
| 2004/0031970 A1 | 2/2004 | Chakravarthi et al. | |
| 2004/0102013 A1 | 5/2004 | Hwang et al. | |
| 2005/0110082 A1 | 5/2005 | Cheng et al. | |
| 2006/0051922 A1 | 3/2006 | Huang et al. | |
| 2006/0216900 A1 | 9/2006 | Wang et al. | |
| 2006/0234455 A1 | 10/2006 | Chen et al. | |

* cited by examiner

Primary Examiner—Asok Kumar Sarkar
(74) Attorney, Agent, or Firm—Slater & Masil, L.L.P.

(57) ABSTRACT

A method of making an integrated circuit chip is provided, which combines a smart grading implant with a diffusion retarding implant, e.g., to improve short channel effect controllability and improve dopant grading in the source/drain regions. Using a smart grading implant, a relatively low-energy high-dose implant is performed before a relatively low-energy high-dose implant. Hence, a relatively high-energy low-dose implant of ions is performed into a source/drain region of a substrate. A diffusion retarding implant is performed into the source/drain region of the substrate. Then after performing the high-energy low-dose implant and the diffusion retarding implant (together, overlapping, or separately), a relatively low-energy high-dose implant of ions is performed into the source/drain region of the substrate.

17 Claims, 5 Drawing Sheets

SMART GRADING IMPLANT WITH DIFFUSION RETARDING IMPLANT FOR MAKING INTEGRATED CIRCUIT CHIPS

TECHNICAL FIELD

The present invention generally relates to integrated circuit chips and methods of manufacturing integrated circuit chips. More particularly, aspects of the present invention relate to methods of implanting source and drain regions for manufacturing transistors in integrated circuit chips.

BACKGROUND

Integrated circuit (IC) chips, such as an ultra-large scale integrated (ULSI) circuits, can include as many as one million transistors or more. A ULSI circuit may include complementary metal oxide semiconductor (CMOS) field effect transistors (FETS). The transistors can include semiconductor gates disposed between drain and source regions. The drain and source regions are typically heavily doped with a P-type dopant (e.g., boron) or an N-type dopant (e.g., phosphorous).

The source and drain regions often include a thin extension that is disposed partially underneath the gate to enhance the transistor performance. Shallow source and drain extensions help to achieve immunity to short-channel effects (SCE), which degrade transistor performance for both N-channel and P-channel transistors. Short-channel effects can cause threshold voltage roll-off and drain-induced barrier lowering. Controlling short-channel effects is particularly important as transistors and gate lengths become smaller.

Figure 1:
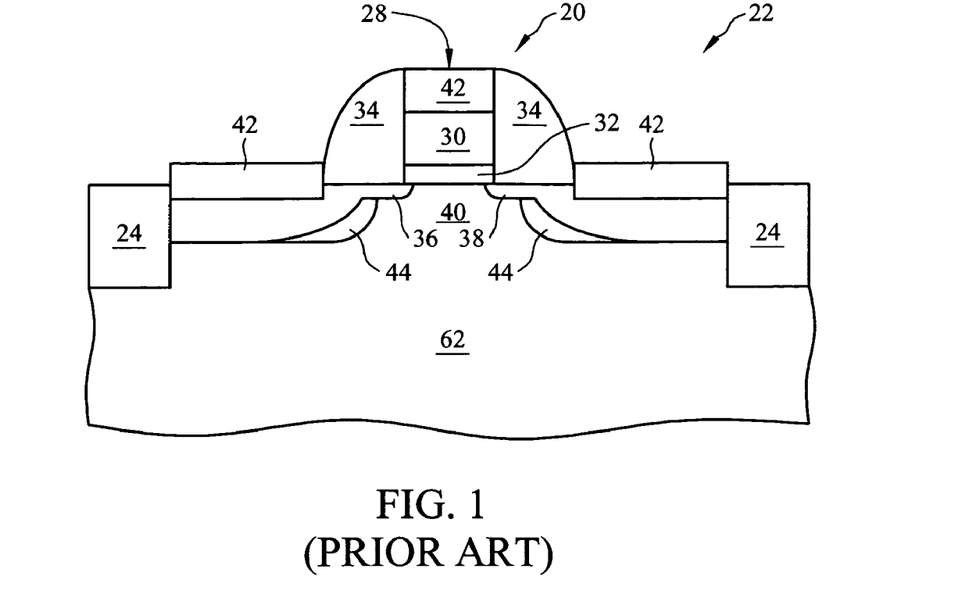
FIGS. 1-3 are cross-section views showing prior art transistors having a variety of doping profiles.

As transistors disposed on integrated circuit chips become smaller (e.g., transistors with gate lengths less than 100 nm), CMOS fabrication processes have utilized a two-dimensional channel-doping technique. FIG. 1 shows an illustrative conventional transistor 20 provided on a portion 22 of an integrated circuit. The transistor 20 is provided between isolation regions 24, and it includes source and drain regions 26 and a gate structure 28. The gate structure 28 includes a gate dielectric 30, and a gate electrode 32. A spacer structure 34 is formed along sidewalls of the gate structure 28.

Figure 2:
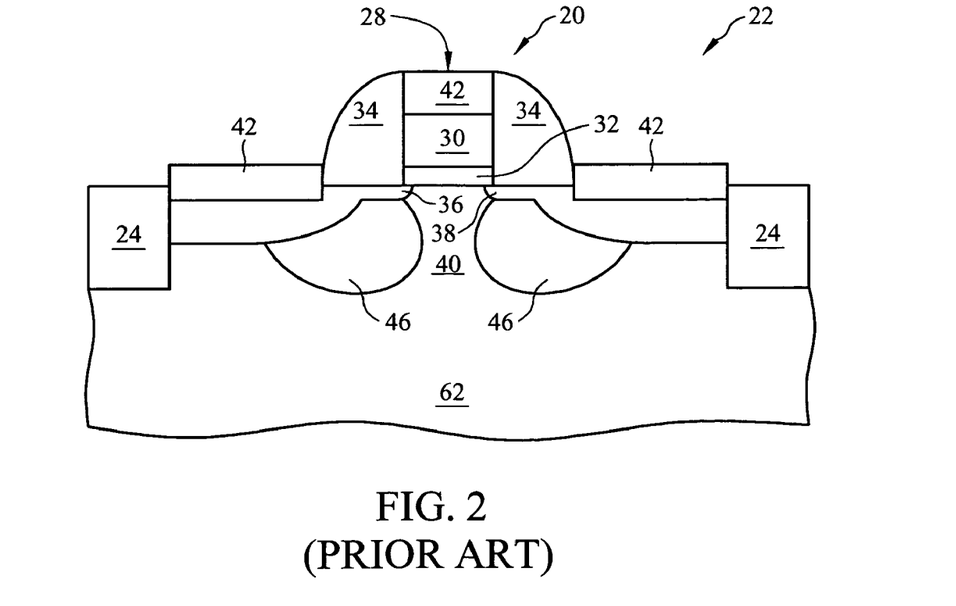
Figure 3:
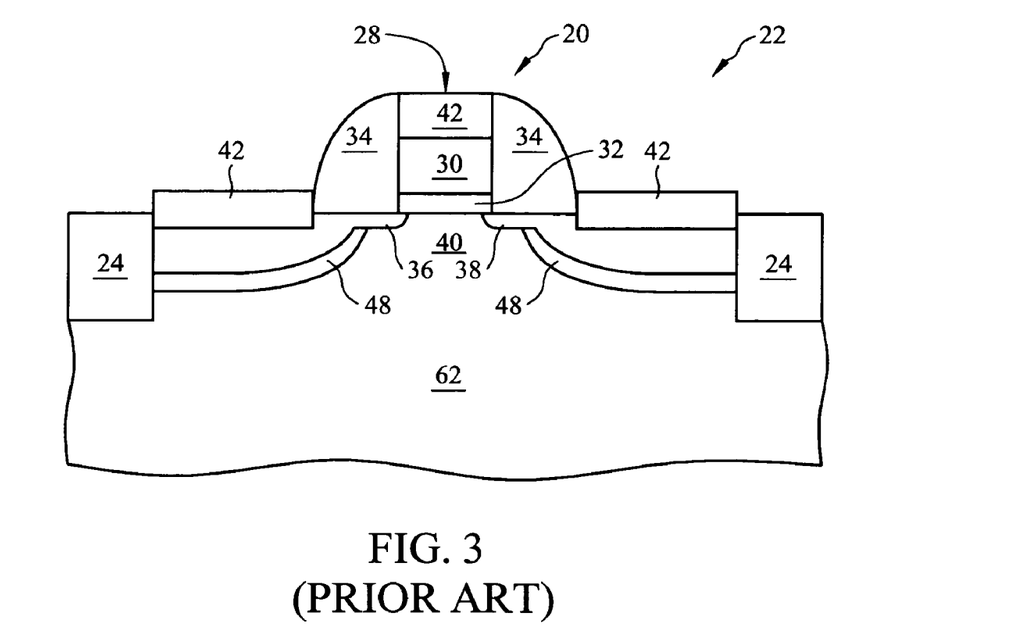

The gate dielectric 30 is located between and partially over a source extension 36 and a drain extension 38 (e.g., above a channel region 40). A silicide layer 42 is formed over gate electrode 32 and over the source and drain regions 26. The transistor 20 includes shallow pocket regions 44, which help suppress the short-channel effect. Short-channel effects are undesirable and degrade the robustness of the transistor 20 to random process variations. The shallow pocket regions 44 are provided in a conventional CMOS pocket implant process. This implant process is performed after gate structure 28 is fabricated and before silicide layer 42 is formed. The size and placement of the pocket regions 44 may vary from that shown in FIG. 1. For example, FIG. 2 shows another illustrative transistor device 20 having larger and deeper, yet localized pocket regions 46, which are currently more preferred in the semiconductor industry by many manufacturers. Generally, it is desired that the pocket regions 46 are deep enough to suppress punch through effects. However, a "halo-like structure" 48, as shown in FIG. 3 for example, is currently less desired than localized pocket regions 46 (see FIG. 2) because the halo regions 48 extend below the source and drain regions 26. The halo-like structure of pocket regions 48 in FIG. 3 tend to increase the doping concentration near the junction of source and drain regions 26. Increased doping concentration near the junction of source and drain regions 26 degrades (i.e., increases) the source/drain junction capacitance (e.g., parasitic capacitance) and, hence, reduces the speed of transistor 20.

A need exists for manufacturing methods allowing for better dopant grading in the source and drain regions without causing increases in adverse short-channel effects and junction capacitance.

SUMMARY OF THE INVENTION

The problems and needs outlined above may be addressed by embodiments of the present invention. In accordance with one aspect of the present invention, a method of making an integrated circuit chip is provided. This method includes the following steps described in this paragraph. The order of the steps may vary, may be sequential, may overlap, may be in parallel, and combinations thereof, if not otherwise stated. A relatively high-energy low-dose implant of ions is performed into a source/drain region of a substrate. A diffusion retarding implant is performed into the source/drain region of the substrate. After performing the high-energy low-dose implant and the diffusion retarding implant, a relatively low-energy high-dose implant of ions is performed into the source/drain region of the substrate.

In accordance with another aspect of the present invention, a method of making an N-channel transistor device is provided. This method includes the following steps described in this paragraph. The order of the steps may vary, may be sequential, may overlap, may be in parallel, and combinations thereof, if not otherwise stated. A spacer structure is formed along the sides of a gate structure. The gate structure is located on a substrate. A relatively high-energy low-dose implant is performed into a source/drain region of the substrate between the spacer and an isolation region. This relatively high-energy low-dose implant includes ions of phosphorous and/or arsenic. The high-energy low-dose implant is performed with an implant energy larger than about 15 keV and a dosage less than about $1 \times 10^{15}$ dopants/cm$^2$. A diffusion retarding implant is performed into the source/drain region of the substrate. The diffusion retarding implant includes ions of carbon and/or fluorine. The diffusion retarding implant is performed at an implant energy between about 2 keV and about 15 keV. After performing the high-energy low-dose implant and the diffusion retarding implant, a relatively low-energy high-dose implant is performed into the source/drain region of the substrate. The low-energy high-dose implant includes ions of phosphorous and/or arsenic. The low-energy high-dose implant is performed with an implant energy less than about 15 keV and a dosage greater than about $1 \times 10^{15}$ dopants/cm$^2$.

In accordance with yet another aspect of the present invention, an integrated circuit chip is provided, which includes a transistor device. The transistor device includes a source/drain region in a substrate. The source/drain region is formed using a doping implant sequence including the steps of (the order of which may vary and/or overlap if not otherwise stated): (i) performing a relatively high-energy low-dose implant of ions into the source/drain region of the substrate; (ii) performing a diffusion retarding implant into the source/drain region of the substrate; and (iii) after performing the high-energy low-dose implant and the diffusion retarding implant, performing a relatively low-energy high-dose implant of ions into the source/drain region of the substrate.

In accordance with still another aspect of the present invention, an integrated circuit chip including a transistor device. The transistor device includes a source/drain region in a substrate. The source/drain region includes: a relatively deeper and lower-dose implant region of ions in the substrate; a diffusion retarding implant region with a concentration percentage from about 1% to about 10% in the substrate; and a relatively shallower and higher-dose implant region of ions in the substrate. These regions may overlap each other.

In accordance with another aspect of the present invention, an integrated circuit chip including a transistor device. The transistor device includes a source/drain region in a substrate. The source/drain region includes: a relatively deeper and lower-dose implant region of ions in the substrate; a diffusion retarding implant region with a concentration percentage greater than about 1% in the substrate; and a relatively shallower and higher-dose implant region of ions in the substrate.

In accordance with yet another aspect of the present invention, an integrated circuit chip including a transistor device. The transistor device includes a source/drain region in a substrate. The source/drain region includes: a relatively deeper and lower-dose implant region of ions in the substrate; a diffusion retarding implant region includes carbon with a concentration from about $5 \times 10^{15}$ cm$^{-2}$ to about $5 \times 10^{16}$ cm$^{-2}$; and a relatively shallower and higher-dose implant region of ions in the substrate.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 4:
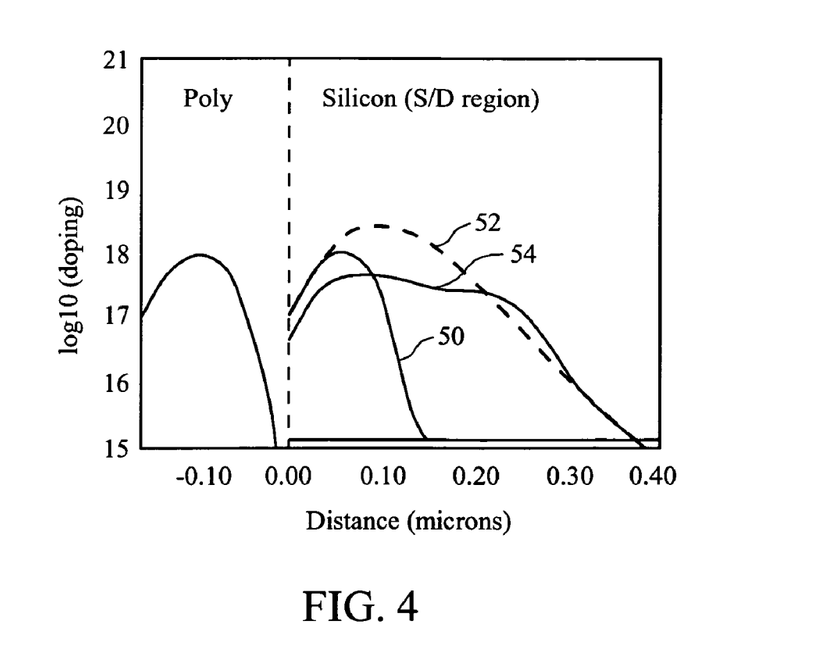
FIGS. 4 and 5 are plots of doping concentration versus depth into the substrate for comparing the concentration curves of convention and smart grading doping implant sequences.

FIG. 4 illustrates concentration curves for a PMOS semiconductor device (boron doping). In a conventional method of doping the source and drain regions, first, a low-energy high-dose implant is performed and then a high-energy low-dose implant is performed. This results in a concentration curve 50, as shown in FIG. 4. Note that the depth of the junction for curve 50 is shallow in FIG. 4. To provide a deeper junction depth, which is often desired, the conventional method will provide a higher concentration curve 52, as shown as a dashed-line curve in FIG. 4. Hence, to obtain a deeper junction, the concentration curve 52 is raised using the conventional method. It is often desirable to provide a deeper junction to improve the junction capacitance (Cj) for a given device. However, the higher concentration level at the peak of the concentration curve 52 in FIG. 4 may create problems with short channel effect (SCE) control by compensating the pocket concentration.

In an embodiment of the present invention, the doping sequence is changed and a smart grading implant is performed. By performing a smart grading implant, the high-energy low-dose implant is permitted to go deeper into the substrate. Then when the low-energy high-dose implant is performed, the resulting concentration curve 54 has better grading, as shown in FIG. 4. Using a smart grading implant, a deeper, yet not higher concentration peak, curve 54 may be achieved. A deeper junction provides a better junction capacitance (Cj). By having a deeper junction with a more evenly graded concentration (see curve 54 in FIG. 4), there are less problems with short channel effect and any short channel effects are more controllable. Also, the more evenly graded concentration curve 54 is more desirable.

Table 1 below shows some numerical data comparing the conventional doping sequence (curve 50 in FIG. 4) and the smart grading doping sequence (curve 54 in FIG. 4) to a baseline.

|  | Baseline | Conventional Doping Sequence (curve 50 in FIG. 4) | Smart Grading Doping Sequence (curve 54 in FIG. 4) |
|---|---|---|---|
| Source/Drain Implant | X | X | 15 keV at T0 $1 \times 10^{13}$ B dopants/cm$^2$ |
|  | 4 keV at T0 $3 \times 10^{15}$ B dopants/cm$^2$ | 4 keV at T0 $3 \times 10^{15}$ B dopants/cm$^2$ | 4 keV at T0 $3 \times 10^{15}$ B dopants/cm$^2$ |
|  | X | B 10 keV at T0 $5 \times 10^{13}$ B dopants/cm$^2$ | X |

-continued

| | Baseline | Conventional Doping Sequence (curve 50 in FIG. 4) | Smart Grading Doping Sequence (curve 54 in FIG. 4) |
|---|---|---|---|
| $V_{tp}$ (10 μm/10 μm) (V) | 0.2 | 0.197 | 0.194 |
| standard deviation (mV) | 10.8 | 9.7 | 11.1 |
| $I_d$ (constant OD) | 2.56 | 2.57 | 2.59 |
| $C_j$ (fF/μm$^2$) | 1.22 | 1.18 | 1.09 |
| $C_j$ reduction (%) | — | 3.3 | 10.7 |
| $C_{jsw}$ (fF/μm) | 0.065 | 0.061 | 0.066 |
| $C_{jsw}\_Po$ (fF/μm) | 0.35 | 0.35 | 0.34 |
| $V_t$ roll off (mV) i.e., $V_t(L_m\ 0.11)$-$V_t(L_m\ 0.085)$ | 74.8 | 113.7 | 91.6 |
| Ring speed (ps) | 7.57 | 7.53 | 7.47 |
| speed reduction (%) | — | 0.5 | 1.3 |

In Table 1, note that the smart grading provides a better driving current ($I_d$). $C_j$ is the junction capacitance. Note that the smart grading provides about a 10.7% reduction, as compared to the 3.3% reduction for the conventional method. $V_t$ roll off is the measure of the threshold voltage for a long channel device compared to a short channel device. Note that the $V_t$ roll off for the smart grading is much smaller (i.e., better) than that of the conventional doping. Generally, when the $V_t$ roll off is lower, the short channel effect (SCE) control is better. When the $V_t$ roll off is larger, typically much more pocket implant doping is needed to compensate for it. Ring speed is a measure of the dampening rate for a given voltage. Note that the ring speed is smaller (i.e., better) for the smart grading, as compared to the conventional doping.

Figure 5:
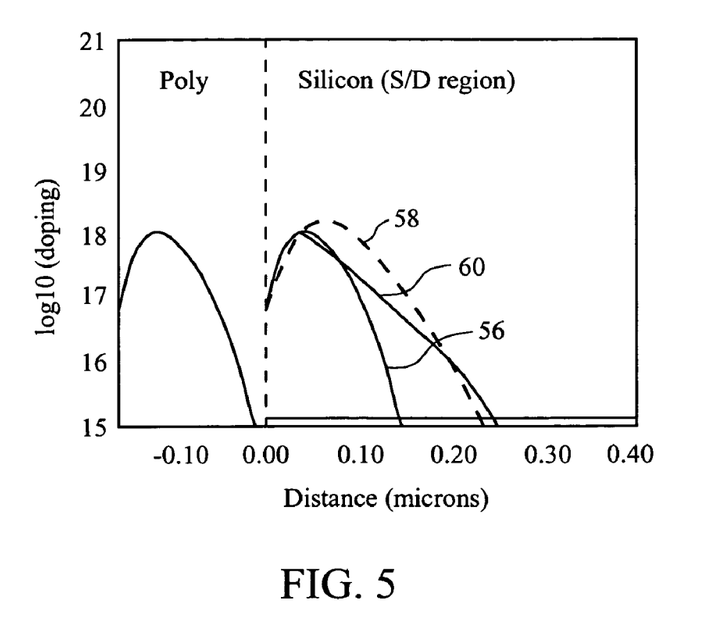

FIG. 5 illustrates concentration curves 56, 58, 60 for comparison of a conventional doping sequence (curves 56 and 58) with a smart grading doping sequence (curve 60) for an NMOS device. The first concentration curve 56 represents the conventional doping sequence into an amorphous silicon substrate (i.e., low-energy high-dose implant first, and then high-energy low-dose implant). The second concentration curve 60 represents the smart grading doping sequence into a crystalline silicon substrate (i.e., high-energy low-dose implant first, and then low-energy high-dose implant). The dashed-line curve 58 represents a conventional doping sequence with a depth comparable to the smart grading doping sequence (curve 60). Note that the dashed-line curve 58 has a higher concentration peak and a greater slope.

Also in an embodiment of the present invention, a diffusion retarding implant is performed using carbon and/or fluorine ions. A diffusion retarding implant that includes carbon, chlorine, and/or fluorine ions may be used to reduce the diffusion rate of phosphorous ions into a channel region. The mechanism of grading by the diffusion retarding implant is that the retarding ions are located in the interstitial sites of the silicon crystal structure of the substrate. There are two requirements for the retarding implant molecules being located in the interstitial sites of the silicon crystal substrate: (1) the lattice size is smaller than silicon; and (2) it is difficult for the retarding molecules to have bonding with the silicon crystal substrate. The preferred concentration percentage (%) for the diffusion retarding implant in the silicon substrate is greater than about 1%. For example, the dose of a carbon implant may be greater than about $5\times10^{15}$ cm$^{-2}$ to provide diffusion retarding characteristics in a preferred embodiment. A practical range of concentration percentage (%) for the diffusion retarding implant may be from about 1% (e.g., $5\times10^{15}$ cm$^{-2}$ for C) to about 10% (e.g., $5\times10^{16}$ cm$^{-2}$ for C), for example.

Figure 6:
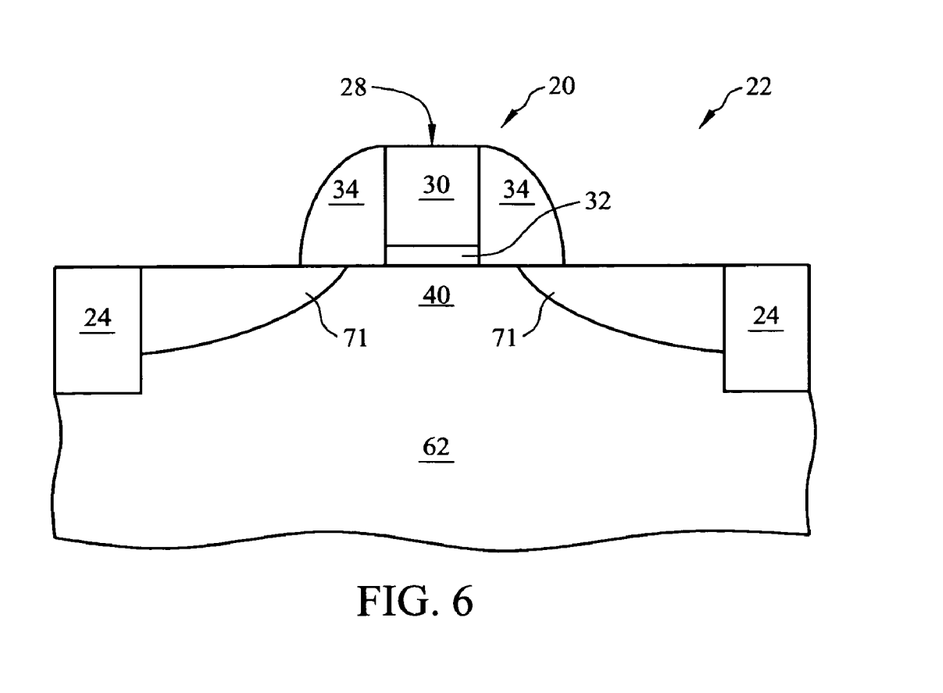
FIGS. 6-9 are simplified schematic cross-section views of a transistor being formed using a method of a first illustrative embodiment of the present invention.

Selected steps for making a transistor 20 for an integrated circuit chip in accordance with a first illustrative embodiment of the present invention are shown in FIGS. 6-9. FIG. 6 shows a simplified cross-section view for a portion 22 of an integrated circuit chip at an intermediate stage. More specifically, FIG. 6 shows an intermediate stage of forming one NMOS transistor 20, among many, on the integrated circuit chip. However, other devices may be formed using an embodiment of the present invention, including but not limited to a PMOS transistor, a fin-FET transistor, a CMOS transistor, a high voltage transistor, a low voltage transistor, or other semiconductor based devices that require doping. At this stage, isolation regions 24, a gate structure 28, and a spacer structure 34 are formed on and in a substrate 62. Note that other structures, details, and features of the transistor 20 at this intermediate stage may not be shown for purposes of simplifying the drawings.

The substrate 62 in FIG. 6 may be a single crystal silicon wafer, for example. The substrate 62 may have any suitable structure and may be made from any suitable material, layers of materials, or combination of materials. For example, a substrate 62 may be a thin-film semiconductor layer that is part of a silicon-on-insulator substrate. The substrate 62 may have a stack of different semiconductor materials to form a strained channel and/or strained source/drain regions, as another example. The substrate 62 may have a deep N-well or P-well region, as yet another example. The substrate 62 may include any suitable semiconductor material, including (but not necessarily limited to): silicon (Si), germanium (Ge), gallium arsenide (GaAs), amorphous silicon, single crystal silicon, polysilicon, or other materials, for example.

The gate structure 28 of the transistor 20 shown in FIG. 6 preferably has a gate length of less than about 100 nm, for example. The gate structure 28 is preferably about 1000-2000 angstroms thick, but may have any other suitable thickness. In an embodiment, the gate electrode 32 may be partially or fully silicided, or may not be silicided. The gate electrode 32 shown in FIGS. 6-9 is simplified for purposes of generically illustrating a gate electrode. The gate electrode 32 may include, for example, amorphous silicon or polysilicon. The gate electrode 32 may be doped along with and/or separately from doping the source and drain regions 26. The gate dielectric 30 may be any suitable dielectric material, and is preferably a high-k dielectric material that is an oxide, for example. The gate dielectric 30 may have a thickness of about 20-50 angstroms, or any suitable thickness or equivalent silicon oxide thickness, for example.

Although the gate dielectric 32 and the gate electrode 30 are shown as being formed without interstitial layers between them, such interstitial layers may be formed there between in other embodiments (not shown). Although the gate electrode 30 is shown in FIGS. 6-9 as a single layer of one material, the gate electrode 30 may include one or materials and/or one or more layers or portions in other embodiments (not shown). Although the gate dielectric 32 is shown in FIGS. 6-9 as a single layer of one material, likewise, the gate dielectric 32 may include one or materials and/or one or more layers or portions in other embodiments (not shown).

The isolation regions 24 are preferably an oxide material, but any suitable dielectric material or combination of materials and/or layers of materials may be used for the isolation region 24 in an embodiment. Although the isolation regions 24 shown in FIGS. 6-9 are shallow trench isolation formed from silicon dioxide, for example, other isolation structures and designs may be implemented into an embodiment as well or in alternative (e.g., field oxide (FOX), deposited oxide, thermally grown oxide, LOCOS, or combinations thereof).

In FIG. 6, the spacer structure 34 is formed along sides of the gate structure 28. Although not shown in FIGS. 6-9 for purposes of simplification of the drawings, the spacer structure 34 may or may not include more than one spacer. The spacer structure 34 may be formed from two or more spacers stacked (horizontally and/or vertically), which may include one or more spacer materials. A spacer may be formed from any suitable spacer material, including (but not limited to): a nitride, silicon nitride, an oxide, an oxi-nitride, or silicon oxide, for example. Forming the spacer structure 34 may be affected through any of a variety of processes (currently known or later developed). In one non-limiting example, the spacer structure 34 may be formed by depositing a nitride material and anisotropically etching selective to silicon.

Still referring to FIG. 6 while describing the first illustrative embodiment, after forming the spacer structure 34, a relatively high-energy low-dose implant of ions (e.g., phosphorous or arsenic) is performed into the source and drain regions 26 of the substrate 62 between the spacer structure 34 and the isolation region 24. The first doped regions 71 formed in the source and drain regions 26 by this implant are illustrated schematically (simplified) in FIG. 6. A relatively high-energy is larger than about 15 keV. A relatively low-dose is a dosage less than about $1 \times 10^{15}$ dopants/cm$^2$.

Figure 7:
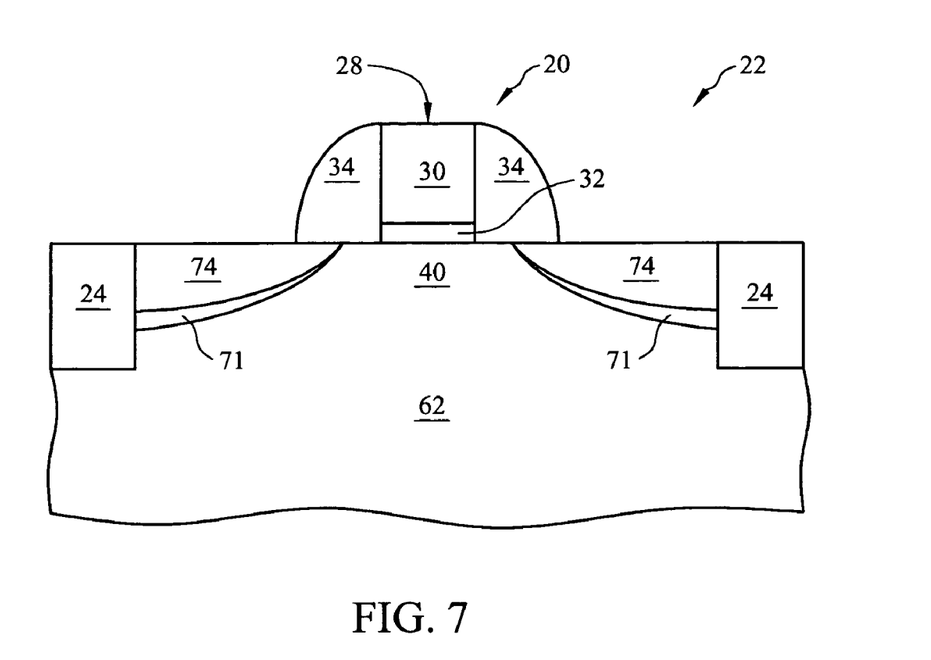

In FIG. 7, preferably using the same spacer structure 34 (but possibly using a different spacer and/or an additional spacer layer added on the spacer structure 34), a diffusion retarding implant is performed into the source and drain regions 26 of the substrate 62. This diffusion retarding implant preferably includes carbon. In other embodiments, however, this diffusion retarding implant may include fluorine or chlorine, for example. In a preferred embodiment, the carbon is implanted at an energy level between about 2 keV and about 15 keV, inclusively, depending upon what location (how deep) it is desired to place the carbon ions. The carbon implanted regions 74 formed in the source and drain regions 26 by this diffusion retarding implant are illustrated schematically (simplified) in FIG. 7. In other embodiments, the diffusion retarding implant may be performed before, during, or overlapping with the relatively high-energy low-dose implant.

Figure 8:
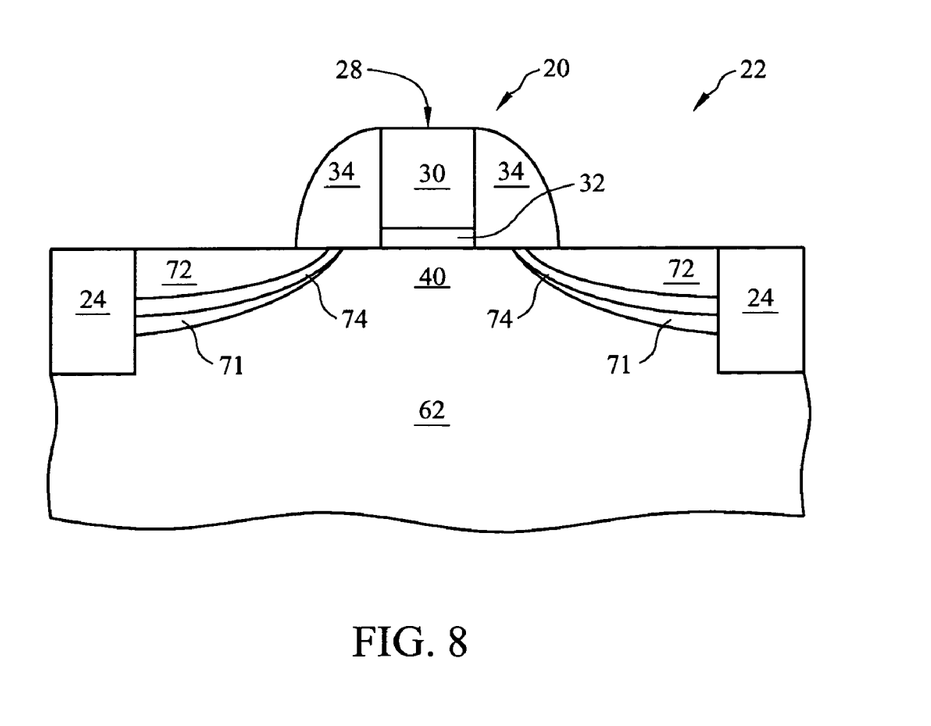

In FIG. 8, preferably using the same spacer structure 34 (but possibly using a different spacer and/or an additional spacer layer added on the spacer structure 34), after performing the relatively high-energy low-dose implant, a relatively low-energy high-dose implant of ions (e.g., phosphorous or arsenic) is performed into the source and drain regions 26 of the substrate 62 between the spacer structure 34 and the isolation region 24. The second doped regions 72 formed in the source and drain regions 26 by this implant are illustrated schematically (simplified) in FIG. 6. A relatively low-energy is less than about 15 keV. A relatively high-dose is a dosage greater than about $1 \times 10^{15}$ dopants/cm$^2$. Thus, in a preferred embodiment of the present invention, a diffusion retarding implant is performed in combination with a smart grading implant.

Figure 9:
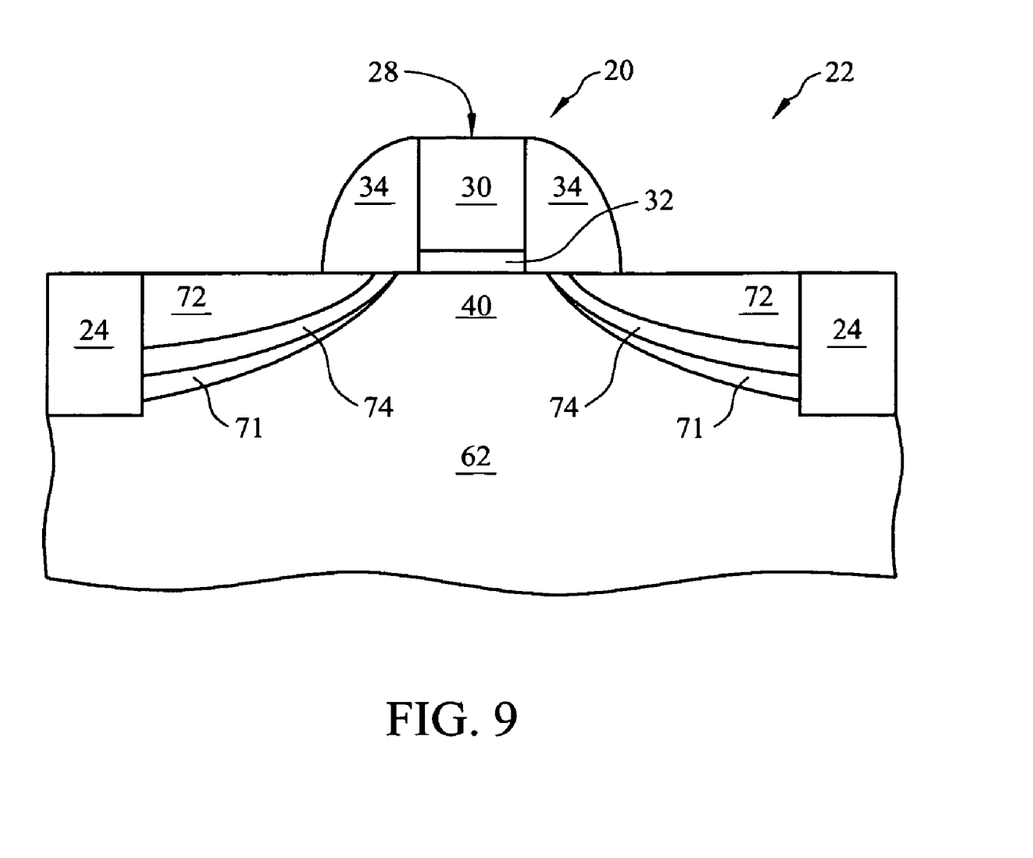

FIG. 9 illustrates schematically (simplified) the resulting doped regions 71, 72 after being diffused during a subsequent annealing step. Due to the diffusion retarding implant (e.g., carbon implanted regions 74), the second doped region 72 (low-energy high-dose implanted ions) are retarded from diffusing into the channel region 40 during the annealing. As a result, the transistor 20 preferably has less of short channel effects, higher sheet resistance, and a minimized polysilicon depletion effect. The annealing may be a rapid thermal annealing or a low temperature annealing, for example. The temperature of the annealing may range from about 900° C. to about 1100° C. for a rapid thermal annealing with an anneal time ranging from about 1 nanosecond to about 10 seconds. The temperature of the annealing for a low temperature annealing may range from about 500° C. to about 850° C. with an anneal time ranging from about 5 minutes to about 10 hours. The currently preferred annealing condition is a rapid thermal annealing with a temperature from about 1000° C. to about 1100° C. for an anneal time of about 1 nanosecond to about 2 seconds, for example.

Although not shown in the sequence of FIGS. 6-9, other steps may be occurring before, after, during, or overlapping with those discussed above. For example, one or more pocket implants may be performed (e.g., prior to forming the spacer structure 34 or part of the spacer structure 34 shown in FIGS. 6-9), if desired or needed. Also, an LDD implant may be performed at some point (e.g., prior to forming the spacer structure 34 or part of the spacer structure 34 shown in FIGS. 6-9), if desired or needed. The source and drain regions 26 are preferably silicided, but may not be in some embodiments. Silicidation (of gate electrode 32, in source and drain regions 26) is not shown in FIGS. 6-9 for purposes of simplifying the drawings. Although not shown in the figures for purposes of simplifying the drawings, soft masks (e.g., photoresist) and/or hard masks (e.g., nitride) may be used to protect regions not being doped during an implant step. These implants, preferably use arsenic and/or phosphorus for an N-channel device and boron for a P-channel device, for example. Other subsequent steps of making the integrated circuit may include contact formation, metal interconnect formation, IMD formations, and other processes, as will be apparent to one of ordinary skill in the art.

Some other advantages that may be provided by an embodiment (in addition to others described above) include (but are not necessarily limited to):

Improving semiconductor device conductivity; and

Improving the gate to drain capacitance of the semiconductor device.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making an integrated circuit chip, comprising:
   following spacer formation, performing a relatively high-energy low-dose implant of ions into a source/drain region of a substrate;
   after performing the high-energy low-dose implant, performing a diffusion retarding implant into the source/drain region of the substrate; and
   after performing the high-energy low-dose implant and the diffusion retarding implant, performing a relatively low-energy high-dose implant of ions into the source/drain region of the substrate.

2. The method of claim 1, wherein the high-energy low-dose implant includes ions selected from a group consisting of phosphorous and arsenic.

3. The method of claim 1, wherein the diffusion retarding implant includes ions selected from a group consisting of carbon and fluorine.

4. The method of claim 1, wherein the low-energy high-dose implant includes ions selected from a group consisting of phosphorous and arsenic.

5. The method of claim 1, wherein at least one N-channel transistor device is formed,
   wherein the high-energy low-dose implant includes ions selected from a group consisting of phosphorous and arsenic,
   wherein the diffusion retarding implant includes ions selected from a group consisting of carbon and fluorine, and
   wherein the low-energy high-dose implant includes ions selected from a group consisting of phosphorous and arsenic.

6. The method of claim 1, wherein the method further comprises:
   annealing the source/drain region; and
   retarding the diffusion of ions from the low-energy high-dose implant during the annealing using elements in the source/drain region provided by the diffusion retarding implant.

7. The method of claim 1, wherein the method further comprises annealing the source/drain region at a temperature ranging from about 900° C. to about 1100° C. and at an anneal time ranging from about 1 nanosecond to about 10 seconds.

8. The method of claim 1, wherein the method further comprises annealing the source/drain region at a temperature ranging from about 500° C. to about 850° C. and an anneal time ranging from about 5 minutes to about 10 hours.

9. The method of claim 1, wherein the high-energy low-dose implant is performed with an implant energy larger than about 15 keV and a dosage less than about $1 \times 10^{15}$ dopants/cm$^2$.

10. The method of claim 1, wherein the low-energy high-dose implant is performed with an implant energy less than about 15 keV and a dosage greater than about $1 \times 10^{15}$ dopants/cm$^2$.

11. The method of claim 1, wherein the diffusion retarding implant is performed with ions comprising carbon and at an implant energy between about 2 keV and about 15 keV.

12. The method of claim 1, wherein the diffusion retarding implant has a concentration percentage from about 1% to about 10% in the substrate.

13. The method of claim 12, wherein the diffusion retarding implant includes carbon with a concentration from about $5 \times 10^{15}$ cm$^{-2}$ to about $5 \times 10^{16}$ cm$^{-2}$.

14. A method of making an N-channel transistor device, comprising:
   forming a spacer structure along sides of a gate structure, the gate structure being located on a substrate;
   performing a relatively high-energy low-dose implant, including ions selected from a group consisting of phosphorous and arsenic, into a source/drain region of the substrate between the spacer and an isolation region, wherein the high-energy low-dose implant is performed with an implant energy larger than about 15 keV and a dosage less than about $1 \times 10^{15}$ dopants/cm$^2$;
   after performing the high-energy low-dose implant, performing a diffusion retarding implant, including ions selected from a group consisting of carbon and fluorine, into the source/drain region of the substrate, wherein the diffusion retarding implant is performed at an implant energy between about 2 keV and about 15 keV; and
   after performing the high-energy low-dose implant and the diffusion retarding implant, performing a relatively low-energy high-dose implant, including ions selected from a group consisting of phosphorous and arsenic, into the source/drain region of the substrate, wherein the low-energy high-dose implant is performed with an implant energy less than about 15 keV and a dosage greater than about $1 \times 10^{15}$ dopants/cm$^2$.

15. The method of claim 14, wherein the method further comprises:
   annealing the source/drain region; and
   retarding the diffusion of ions from the low-energy high-dose implant during the annealing using elements in the source/drain region provided by the diffusion retarding implant.

16. A method of making an integrated circuit chip, comprising:
   following spacer formation, performing a relatively high-energy low-dose implant of ions into a source/drain region of a substrate;
   after performing the high-energy low-dose implant, performing a diffusion retarding implant into the source/drain region of the substrate, wherein the diffusion retarding implant has a concentration percentage from about 1% to about 10% in the substrate; and
   after performing the high-energy low-dose implant and the diffusion retarding implant, performing a relatively low-energy high-dose implant of ions into the source/drain region of the substrate.

17. The method of claim 16, wherein the diffusion retarding implant includes carbon with a concentration from about $5 \times 10^{15}$ cm$^{-2}$ to about $5 \times 10^{16}$ cm$^{-2}$.

* * * * *

UNITED STATES PATENT AND TRADEMARK OFFICE
CERTIFICATE OF CORRECTION

PATENT NO. : 7,320,921 B2 Page 1 of 1
APPLICATION NO. : 11/086498
DATED : January 22, 2008
INVENTOR(S) : Wang et al.

It is certified that error appears in the above-identified patent and that said Letters Patent is hereby corrected as shown below:

In Col. 7, line 6, before materials, insert --more--.
In Col. 7, line 10, before materials, insert --more--.

Signed and Sealed this

Twentieth Day of May, 2008

JON W. DUDAS
*Director of the United States Patent and Trademark Office*